United States Patent
Liu et al.

(10) Patent No.: US 8,741,728 B2
(45) Date of Patent: Jun. 3, 2014

(54) CIRCUIT, BIASING SCHEME AND FABRICATION METHOD FOR DIODE ACCESSED CROSS-POINT RESISTIVE MEMORY ARRAY

(75) Inventors: Jun Liu, Boise, ID (US); David Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/614,513

(22) Filed: Sep. 13, 2012

(65) Prior Publication Data

US 2013/0011992 A1  Jan. 10, 2013

(51) Int. Cl.
*H01L 21/02* (2006.01)

(52) U.S. Cl.
USPC .................................. 438/382; 257/E21.004

(58) Field of Classification Search
None
See application file for complete search history.

(56) References Cited

U.S. PATENT DOCUMENTS

| 5,471,417 | A | 11/1995 | Krautschneider et al. |
| 6,118,205 | A * | 9/2000 | Wood et al. ............... 310/316.01 |
| 7,180,772 | B2 * | 2/2007 | Rinerson et al. .............. 365/171 |
| 7,365,382 | B2 * | 4/2008 | Willer et al. .................. 257/295 |
| 2002/0140106 | A1 | 10/2002 | Kurjanowicz |
| 2003/0123284 | A1 | 7/2003 | Lowrey et al. |
| 2003/0185048 | A1 | 10/2003 | Fricke et al. |
| 2004/0047180 | A1* | 3/2004 | Perner .......................... 365/173 |
| 2004/0160805 | A1 | 8/2004 | Rinerson et al. |
| 2004/0160819 | A1 | 8/2004 | Rinerson et al. |

FOREIGN PATENT DOCUMENTS

| EP | 1 365 416 A1 | 11/2003 |
| EP | 1 376 604 A1 | 1/2004 |

* cited by examiner

*Primary Examiner* — Seahvosh Nikmanesh
(74) *Attorney, Agent, or Firm* — Dickstein Shapiro LLP

(57) ABSTRACT

Methods, systems, structures and arrays are disclosed, such as a resistive memory array which includes access devices, for example, back-to-back Zener diodes, that only allow current to pass through a coupled resistive memory cell when a voltage drop applied to the access device is greater than a critical voltage. The array may be biased to reduce standby currents and improve delay times between programming and read operations.

5 Claims, 17 Drawing Sheets

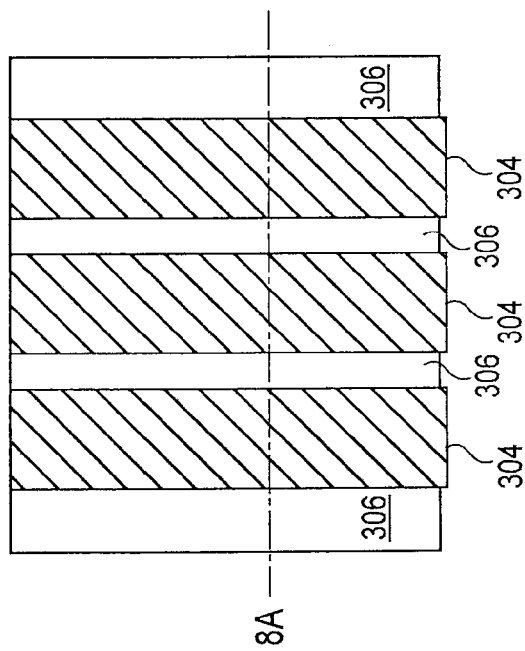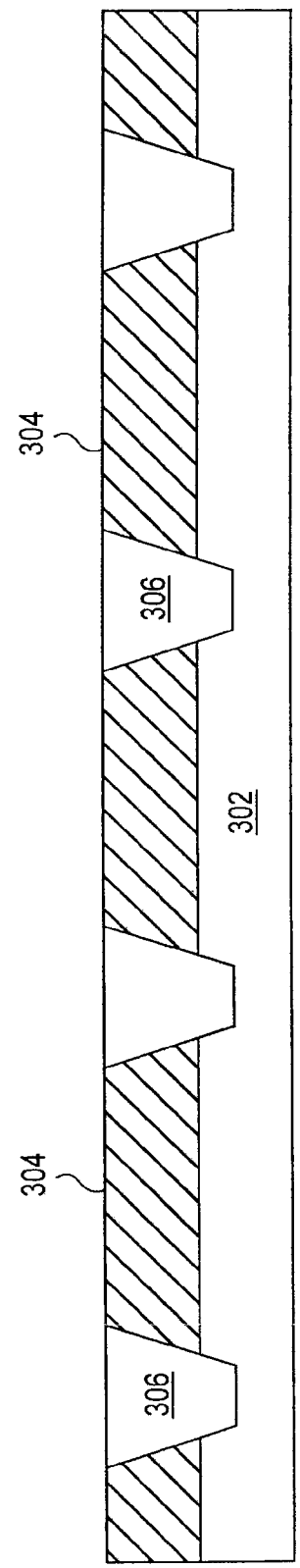

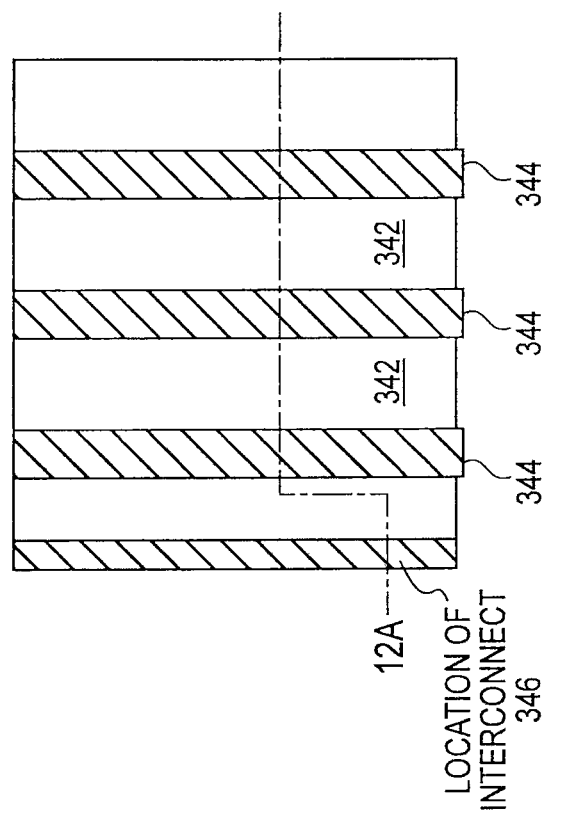

CIRCUIT, BIASING SCHEME AND FABRICATION METHOD FOR DIODE ACCESSED CROSS-POINT RESISTIVE MEMORY ARRAY

CROSS REFERENCE TO RELATED APPLICATIONS

The present application is a divisional of U.S. application Ser. No. 11/812,004, filed Jun. 14, 2007, the disclosure of which is herewith incorporated by reference in its entirety.

FIELD OF THE INVENTION

The embodiments of the invention relate generally to the field of semiconductor devices and, more particularly, to resistive memory devices, e.g., phase change memory devices.

BACKGROUND OF THE INVENTION

Microprocessor-accessible memory devices have traditionally been classified as either non-volatile or volatile memory devices. Non-volatile memory devices are capable of retaining stored information even when power to the memory device is turned off. Traditionally, however, non-volatile memory devices occupy a large amount of space and consume large quantities of power, making these devices unsuitable for use in portable devices or as substitutes for frequently-accessed volatile memory devices. On the other hand, volatile memory devices tend to provide greater storage capability and programming options than non-volatile memory devices. Volatile memory devices also generally consume less power than non-volatile devices. However, volatile memory devices require a continuous power supply in order to retain stored memory content.

Research and development of commercially viable memory devices that are randomly accessed, have relatively low power consumption, and are non-volatile is ongoing. One ongoing area of research is in resistive memory cells where resistance states can be programmably changed. One avenue of research relates to devices that store data in memory cells by structurally or chemically changing a physical property of the memory cells in response to applied programming voltages, which in turn change cell resistance. Examples of variable resistance memory devices being investigated include memories using variable resistance polymers, perovskite, doped amorphous silicon, phase-changing, glasses, and doped chalcogenide glass, among others.

FIG. 1 shows a basic composition of a typical resistive memory cell such as a phase change memory cell 10 constructed over a substrate 12, having a variable resistance material, e.g., a phase change material 16 formed between a bottom electrode 14 and a top electrode 18. One type of variable resistance material may be amorphous silicon doped with V, Co, Ni, Pd, Fe and Mn as disclosed in U.S. Pat. No. 5,541,869 to Rose et al. Another type of variable resistance material may include perovskite materials such as $Pr_{(1-x)}Ca_xMnO_3$ (PCMO), $La_{(1-x)}Ca_xMnO_3$ (LCMO), $LaSrMnO_3$ (LSMO), $GdBaCo_xO_y$ (GBCO) as disclosed in U.S. Pat. No. 6,473,332 to Ignatiev et al. Still another type of variable resistance material may be a doped chalcogenide glass of the formula $A_xB_y$, where "B" is selected from among S, Se and Te and mixtures thereof, and where "A" includes at least one element from Group III-A (B, Al, Ga, In, Tl), Group IV-A (C, Si, Ge, Sn, Pb), Group V-A (N, P, As, Sb, Bi), or Group VII-A (F, Cl, Br, I, At) of the periodic table, and with the dopant being selected from among the noble metals and transition metals, including Ag, Au, Pt, Cu, Cd, Ir, Ru, Co, Cr, Mn or Ni, as disclosed in U.S. Pat. Nos. 6,881,623 and 6,888,155 to Campbell et al. and Campbell, respectively. Yet another type of variable resistance material includes a carbon-polymer film comprising carbon black particulates or graphite, for example, mixed into a plastic polymer, such as that disclosed in U.S. Pat. No. 6,072,716 to Jacobson et al. The material used to form the electrodes 14, 18 can be selected from a variety of conductive materials, such as tungsten, nickel, tantalum, titanium, titanium nitride, aluminum, platinum, or silver, among others.

Much research has focused on memory devices using memory elements composed of chalcogenides. Chalcogenides are alloys of Group VI elements of the periodic table, such as Te or Se. A specific chalcogenide currently used in rewriteable compact discs ("CD-RWs") is $Ge_2Sb_2Te_5$. In addition to having valuable optical properties that are utilized in CD-RW discs, $Ge_2Sb_2Te_5$ also has desirable physical properties as a variable resistance material. Various combinations of Ge, Sb and Te may be used as variable resistance materials and which are herein collectively referred to as GST materials. Specifically, GSTs can change structural phases between an amorphous phase and two crystalline phases. The resistance of the amorphous phase ("a-GST") and the resistances of the cubic and hexagonal crystalline phases ("c-GST" and "h-GST," respectively) can differ significantly. The resistance of amorphous GST is greater than the resistances of either cubic GST or hexagonal GST, whose resistances are similar to each other. Thus, in comparing the resistances of the various phases of GST, GST may be considered a two-state material (amorphous GST and crystalline GST), with each state having a different resistance that can be equated with a corresponding binary state. A variable resistance material such as GST whose resistance changes according to its material phase is referred to as a phase change material.

The transition from one GST phase to another occurs in response to temperature changes of the GST material. The temperature changes, i.e., the heating and cooling, can be caused by passing differing amounts of current through the GST material. The GST material is placed in a crystalline state by passing a crystallizing current through the GST material, thus warming the GST material to a temperature which induces a crystalline structure. A stronger melting current is used to melt the GST material for subsequent cooling to an amorphous state. As the typical phase change memory cell uses the crystalline state to represent one logical state binary, e.g., "1," and the amorphous state to represent another logical state binary, e.g., "0," the crystallizing current is referred to as a set current $I_{SET}$ (which is sometimes also referred to as a write current) and the melting current is referred to as a reset current $I_{RST}$ (which is sometimes also referred to as an erase current). One skilled in the art will understand, however, that the assignment of GST states to binary values may be switched if desired.

Resistive memory cells 10 are organized into resistive memory bit structures. One method of arranging resistive memory bit structures, as disclosed in U.S. Pat. No. 6,961,258 to Lowrey, is by using a diode accessed cross-point resistive memory array, illustrated in FIG. 2. The memory array 50 includes resistive memory cells 10 electrically interconnected in series with bipolar diodes 60. Bit lines 70a-70e and word lines 80a-80d are connected to external addressing circuitry. The array 50 enables each discrete resistive memory cell 10 to be read from and written to without interfering with the information stored in adjacent or remote memory elements of the array 50. For example, selected resistive memory cell 90 is selected by properly biasing bit line 70b and word line 80b. For a reset operation, bit line 70b may be biased at a pumped voltage $V_{CCP}$ while word line 80b may be kept at 0 V, thus creating a reset voltage drop across the selected resistive memory cell 90 and associated bipolar diode 60 (with accompanying reset current $I_{RST}$). The other bit lines 70a, 70c, 70d, 70e not being used for selection are biased at 0 V, while the other word lines 80a, 80c, 80d not being used for selection are biased at $V_{CCP}$. The resulting reverse bias voltage across most of the bits in the array 50 will have a magnitude of $V_{CCP}$.

For a write operation (which is sometimes also referred to as a set operation) performed on the selected resistive memory cell 90, bit line 70b may be biased at a write voltage while word line 80b may be kept at 0 V. The unselected bits are reverse biased. In order to minimize leakage currents caused by the reverse bias across the bipolar diodes 60, only the section of the array 50 that is being written is biased for the write operation. The remainder of the array 50 is instead reverse biased at a lower magnitude, generally the bias used for a read operation. The reverse bias for the majority of resistive memory cells during a read operation is about 1.5 V. This means that during a set operation, most bipolar diodes 60 in the array 50 are reverse biased with a magnitude of at least 1.5 V, with some reverse biased at an even greater write voltage (e.g., 3 V). Considering the large number of reverse biased diodes in the array 50, the resulting standby current results in significant power consumption.

The array 50 also has a large write-to-read delay. Due to the difference in voltages on the unselected bit lines during write and read operations, a delay of approximately 1 μs is incurred between a write and a read operation (or vice versa). A delay is also incurred on consecutive writes if they are located in different sections of the array 50.

Methods and structures to reduce standby power consumption and reduce operational delays in a diode accessed cross-point resistive memory array are desired.

BRIEF DESCRIPTION OF THE DRAWINGS

FIGS. 8A-12B are representations of fabrication stages used in the formation of a back-to-back Zener diode accessed cross-point resistive memory array according to a disclosed embodiment.

DETAILED DESCRIPTION

Figure 1:
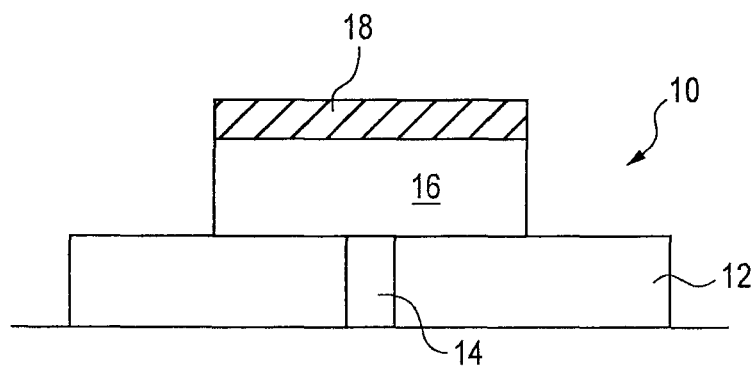
FIG. 1 illustrates a typical phase change memory cell.
Figure 2:
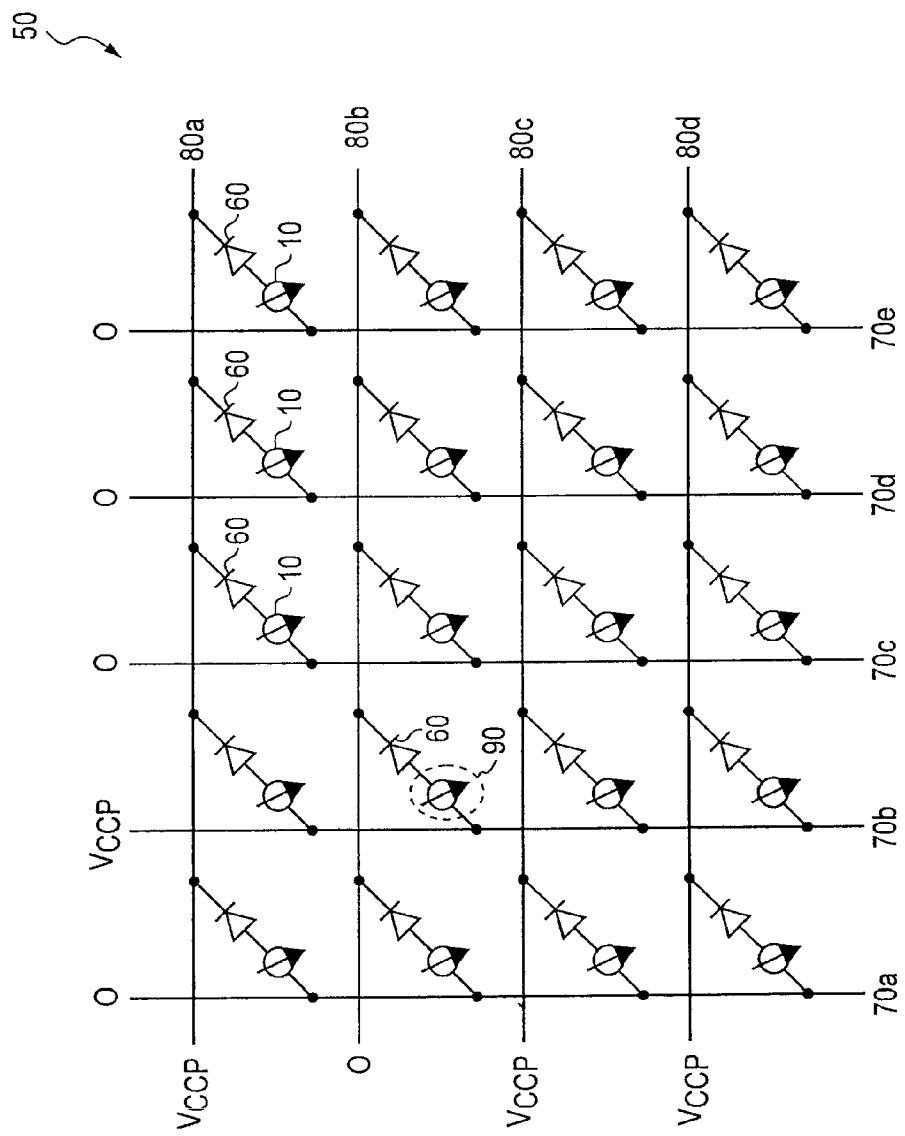
FIG. 2 is a schematic representation of a diode accessed cross-point resistive memory array.
Figure 3:
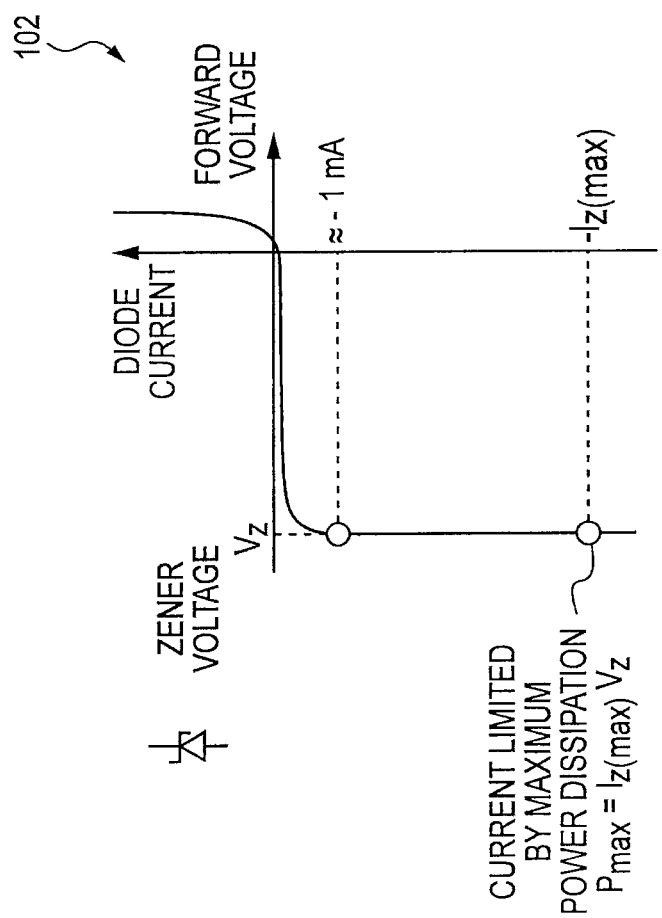
FIG. 3 is a current-voltage chart of a Zener diode.

In order to, for example, reduce standby power consumption and/or operational delays in a diode accessed cross-point resistive memory array, back-to-back Zener diodes may be used instead of the single diode used in the prior art. A Zener diode has a current-voltage (i.e., I-V) chart 102 as shown in FIG. 3. In the I-V chart 102, current is represented on the vertical axis. Voltage is represented on the horizontal axis. When a Zener diode is positively biased (i.e., when the voltage is positive in the I-V chart 102), a Zener diode acts like a typical bipolar diode. However, when a Zener diode is reverse biased (i.e., the applied voltage is negative in the I-V chart 102), very little leakage current flows and the Zener diode acts effectively as an open circuit as long as the magnitude of the reverse bias is less than the Zener voltage $V_Z$. When the reverse bias is increased to the Zener voltage $V_Z$, the Zener diode breaks down and a dramatic increase in current occurs. The increase in current is limited only by the maximum power dissipation of the circuit through which the current flows.

Figure 4:
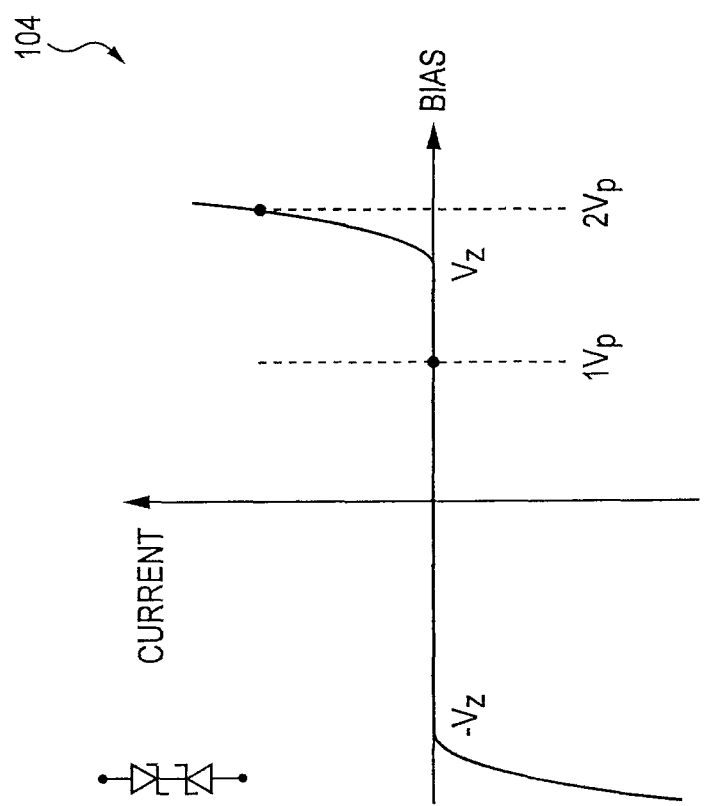
FIG. 4 is a current-voltage chart of back-to-back Zener diodes.

Two Zener diodes may be connected in series back-to-back (with such a pair being referred to hereinafter as back-to-back Zener diodes). FIG. 4 depicts the I-V chart 104 for two Zener diodes connected back-to-back. As expected, the I-V chart 104 shows that current only flows through back-to-back Zener diodes if the applied bias is greater in magnitude than the Zener voltage $V_Z$. As an example, a programming bias VP could be applied such that a bias of 1 $V_P$ is less than the Zener voltage $V_Z$ and hence no current would flow through the Zener diodes, but that a bias of 2 $V_P$ is more than the Zener voltage $V_Z$, meaning current would flow through the Zener diodes.

Figure 5:
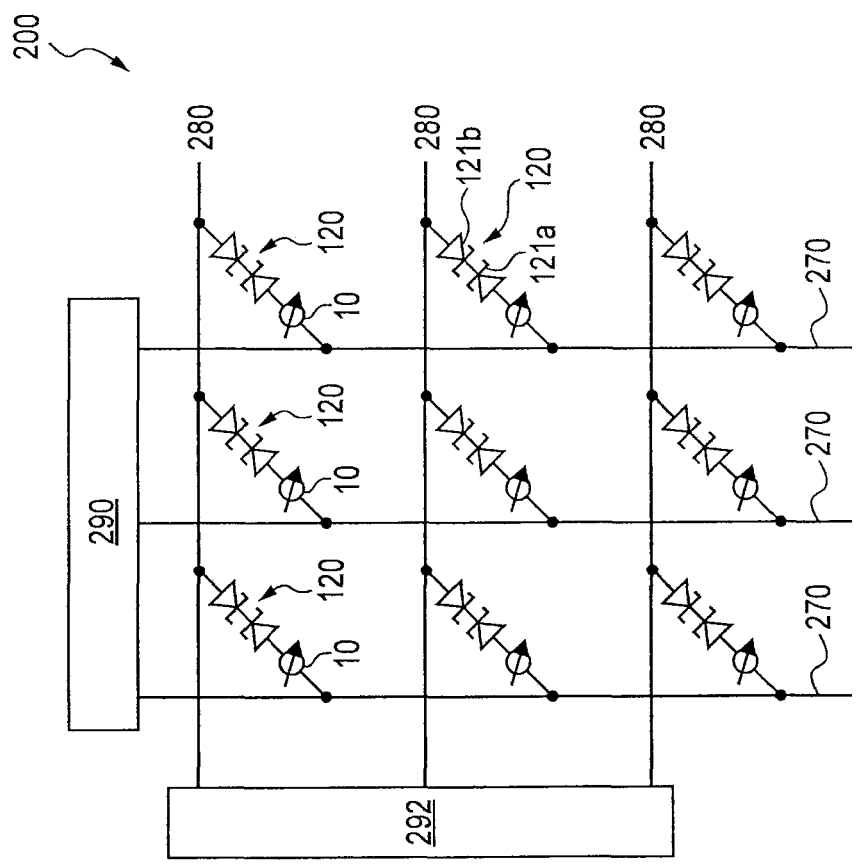
FIG. 5 is a schematic representation of a back-to-back Zener diode accessed cross-point resistive memory array according to a disclosed embodiment.

In an embodiment of the invention, back-to-back Zener diodes 120 are placed in series with each resistive memory cell 10 in a back-to-back Zener diode accessed cross-point resistive memory array 200, as illustrated in FIG. 5. That is, two Zener diodes 121a, 121b are connected to each other and in series with a resistive memory cell 10. Bit lines 270 and word lines 280 are used to individually select a specific resistive memory cell 10. Addressing or other biasing signals are conveyed along the bit lines 270 via column addressing circuitry 290. Addressing or other biasing signals are conveyed along the word lines 280 via row addressing circuitry 292. Using the back-to-back Zener diodes 120 as an access device, the cross-point array 200 need not be biased at voltages that negatively affect power consumption or programming time. In other words, and as is explained below, the bit lines 270 and word lines 280 of the cross-point array 200 may be biased at ground during standby mode (i.e., when no write, reset, or read operations are being performed) to minimize standby current. Additionally, biasing the array 200 to ground during standby mode reduces the delay times for subsequent read or programming operations. When programming (e.g., writing or erasing) or reading the resistive memory cells, an appropriate positive voltage pulse is applied to the selected bit line and an appropriate negative voltage pulse is applied to the selected word line to turn on the selected back-to-back Zener diodes only, while non-selected word lines and bit lines are biased at ground with the majority of the Zener diodes consuming no current and power.

As an example biasing scheme for the circuit 200, a designated memory cell 10 may be read or programmed by biasing the bit line 270 coupled to the memory cell 10 at an appropriate positive programming voltage $V_P$ and the word line coupled to the memory cell 10 at a negative programming voltage $-V_P$. The voltage across the back-to-back Zener diodes 120 and the selected resistive memory cell 10 is $2V_P$, which is larger than the Zener voltage $V_Z$ (as illustrated in FIG. 4). Because the applied voltage exceeds the Zener voltage $V_Z$, the reverse biased Zener diode of the back-to-back Zener diodes 120 operates in the high current, low resistance region, while the other Zener diode of the back-to-back Zener diodes 120 works as a forwardly biased diode. All of the other bit lines 270 and word lines 280 are biased at ground. Thus, the voltage across the unselected back-to-back Zener diodes 120 and resistive memory cells 10 is, at most, only $V_P$, which is less than the Zener voltage $V_Z$. The unselected back-to-back Zener diodes 120 and resistive memory cells 10 only allow minimal leakage current.

For example, it is assumed that the Zener voltage $V_Z$ is about 3.3V. During reset programming, a programming voltage $V_P$ of 3V is used (i.e., the selected word line is biased at 3V and the selected bit line is biased at −3V). The reverse biased diode of the back-to-back Zener diodes 120 pins its bias to 3.3V while the forwardly biased diode and the resistive memory cell 10 are biased at 2.7V, sufficient for a reset operation. During write programming, the programming voltage $V_P$ is set to 2.6V, meaning that the selected bit line is biased at 2.6V while the selected word line is biased at −2.6V. The reverse biased diode of the back-to-back Zener diodes 120 pins its bias to 3.3V while the forward biased diode and resistive memory cell are biased at 1.9V, sufficient for a set operation, but not large enough for a reset operation. For a read operation, the programming voltage $V_P$ is set at 2.2V, meaning that the selected bit line is biased at 2.2V and the selected word line is biased at −2.2V. The reverse biased diode of the back-to-back Zener diodes 120 pins its bias to 3.3V while the forward biased diode and resistive memory cell are biased at 1.1 V, sufficient for a read operation, but not large enough for a write or a reset operation. Finally, for non-selected resistive memory cells, during a programming or read operation, there is a zero bias on either of the connected word or bit lines if the resistive memory cells are not connected to the selected word line or the selected bit line. For resistive memory cells 10 connected to either the selected word line or bit line, one of the Zener diodes of the back-to-back Zener diodes 120 is reverse biased below the Zener voltage and so minimal current flows. During standby mode, there is no bias and hence no leak current.

Figure 6A:
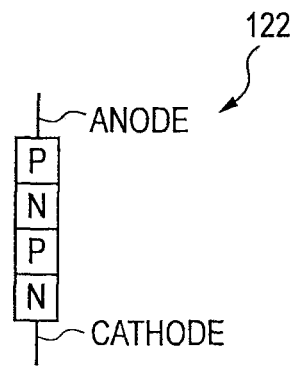
FIGS. 6A and 6B are representations of a Shockley diode and the current-voltage chart of a Shockley diode, respectively.
Figure 6B:
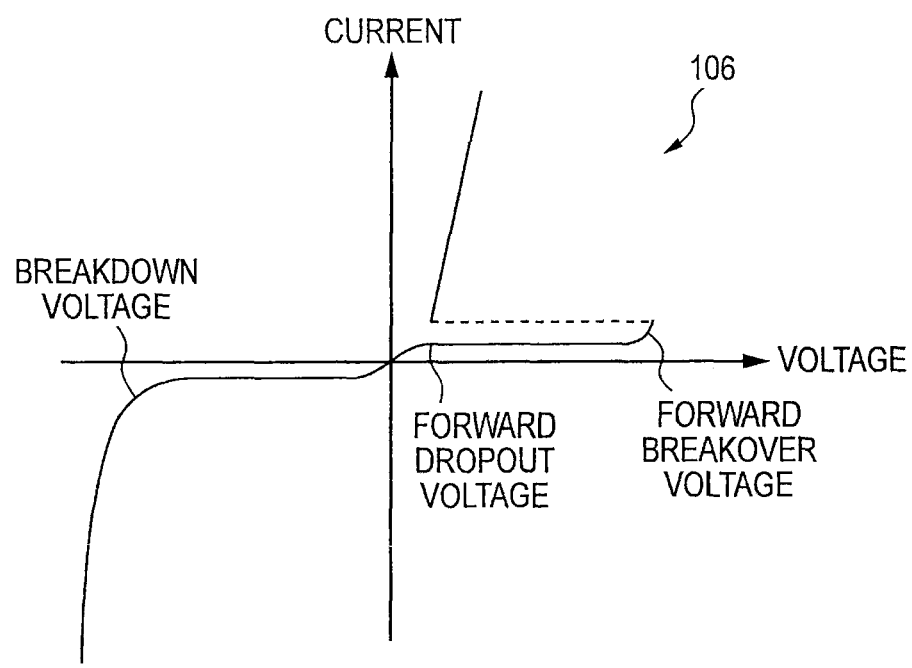

In addition to using back-to-back Zener diodes 120, other circuit elements may be used. For example, a four-layer diode, also known as a PNPN diode or a Schockley diode may be used instead of the back-to-back Zener diodes 120. FIG. 6A illustrates a Shockley diode 122, and FIG. 6B illustrates the corresponding I-V curve 106 for a Shockley diode 122. The I-V curve 106 for a Shockley diode 122 shows that a Shockley diode acts like a Zener diode when negatively biased—i.e., no current flows through the Shockley diode until a breakdown voltage is reached. When a positive bias is applied, no current flows until a forward breakover voltage is reached. When a forward breakover voltage is reached, the Shockley diode 122 breaks down and switches into a latched state wherein current flows freely until the applied bias is reduced below a forward dropout voltage.

Figure 7A:
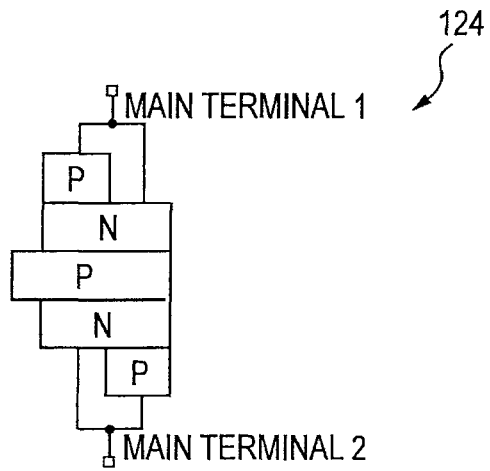
FIGS. 7A and 7B are representations of a Triac diode and the current voltage chart of a Triac diode, respectively.
Figure 7B:
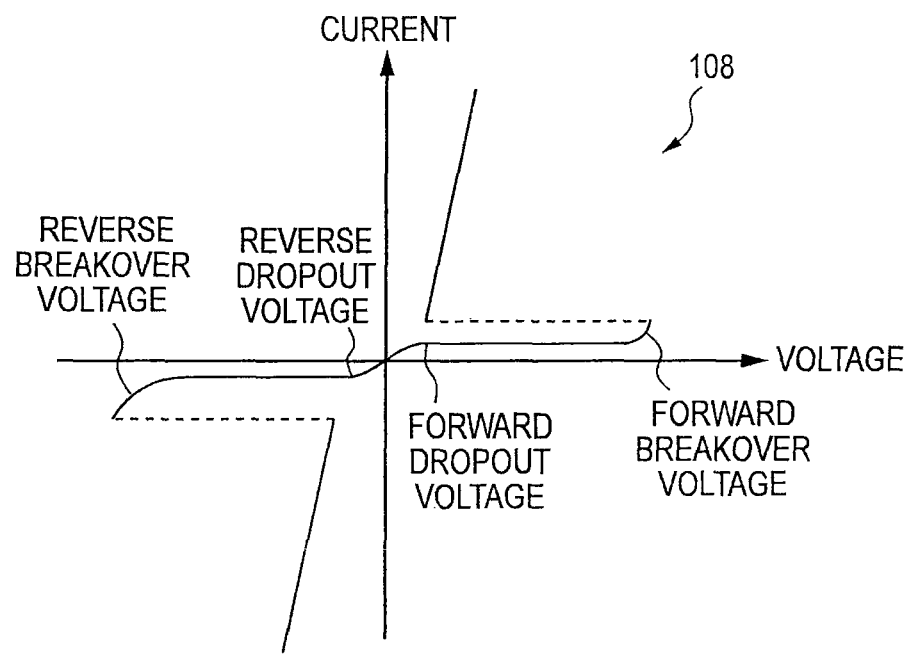

A Triac diode may also be used in place of the back-to-back Zener diodes. A Triac diode 124 is illustrated in FIG. 7A, and the corresponding I-V curve 108 is illustrated in FIG. 7B. The I-V curve 108 for a Triac diode 124 shows that a Triac diode 124 has a forward and a reverse breakover voltage. In other words, like the Shockley diode 122, a Triac diode 124 allows no current to flow when the applied bias is positive but less than a forward breakover voltage. When a forward breakover voltage is reached, the Triac diode 124 breaks down and switches into a latched state wherein current flows freely until the applied bias is reduced below a forward dropout voltage, at which point current is once again blocked from flowing through the Triac diode 124. Similarly, no current flows through the Triac diode 124 when the applied bias is negative but still less than a reverse breakover voltage. When a reverse breakover voltage is reached, the Triac diode 124 breaks down and switches into a latched state and current flows freely until the applied bias is reduced in magnitude below a reverse dropout voltage.

The array 200 is fabricated using various microfabrication techniques. As an example, FIGS. 8A-12B illustrate a method of forming the back-to-back Zener diode accessed cross-point resistive memory cell array 200. In FIGS. 8A and 8B, a p-doped substrate 302 is provided (e.g., p-Si). The p-doped substrate 302 may also be a foundational layer of a multi-layered structure. Phosphorous or arsenic implantation is used, for example, to change the surface of the substrate from a p-doped region to an n-doped region 304. Shallow trench isolation ("STI") is used to form trenches 306 to isolate regions of the n-doped region 304.

Figure 9B:
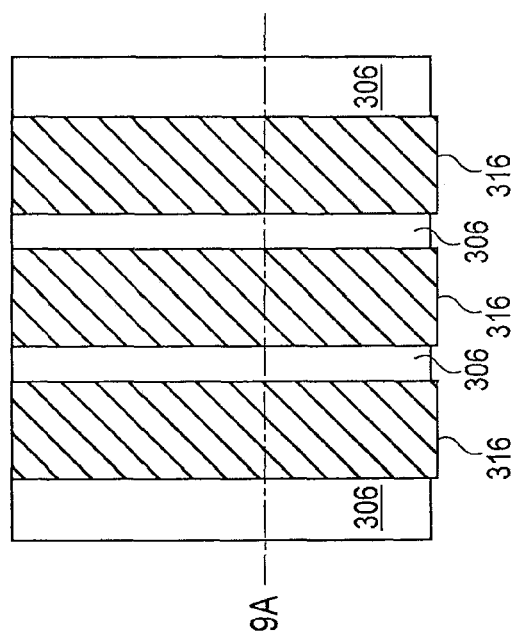
Figure 9A:
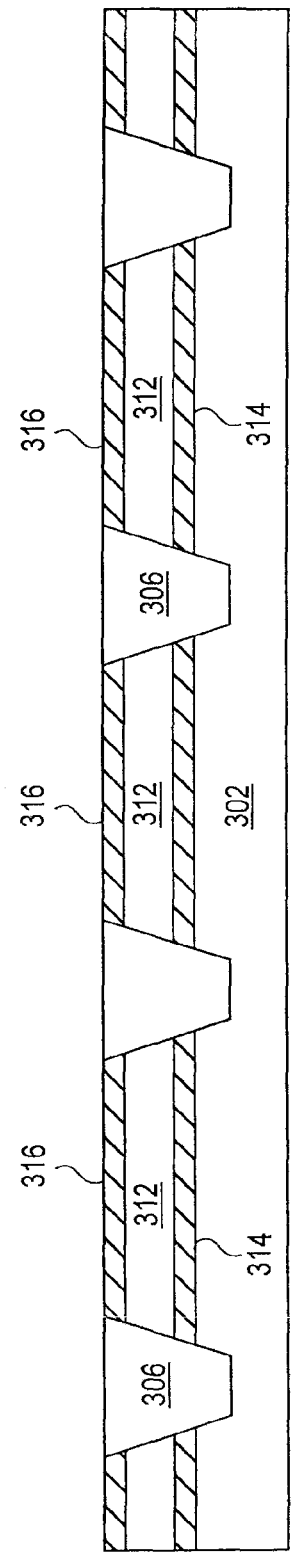

In FIGS. 9A and 9B, the n-doped region 304 is subjected to p-type implantation using, for example, boron, in order to produce a p-type layer 312 within the n-doped region 304, now subdivided into a first n-doped region 314 and a second n-doped region 316. The combination of the first and second n-doped regions 314, 316 and the p-type layer 312 forms back-to-back Zener diodes between each isolation trench 306. The p-type layer 312 is formed to be sufficiently thick so as to minimize any parasitic n/p/n transistor gain. One skilled in the art will recognize that, using this same technique, multiple p- and n-doped regions may be formed in order to create other diode structures such as a Shockley diode or a Triac diode. The diode structures are further isolated from each other as indicated in the top view of FIG. 9D. Dry etch to the word line 314 and STI are used to fully isolate the diodes.

Figure 9C:
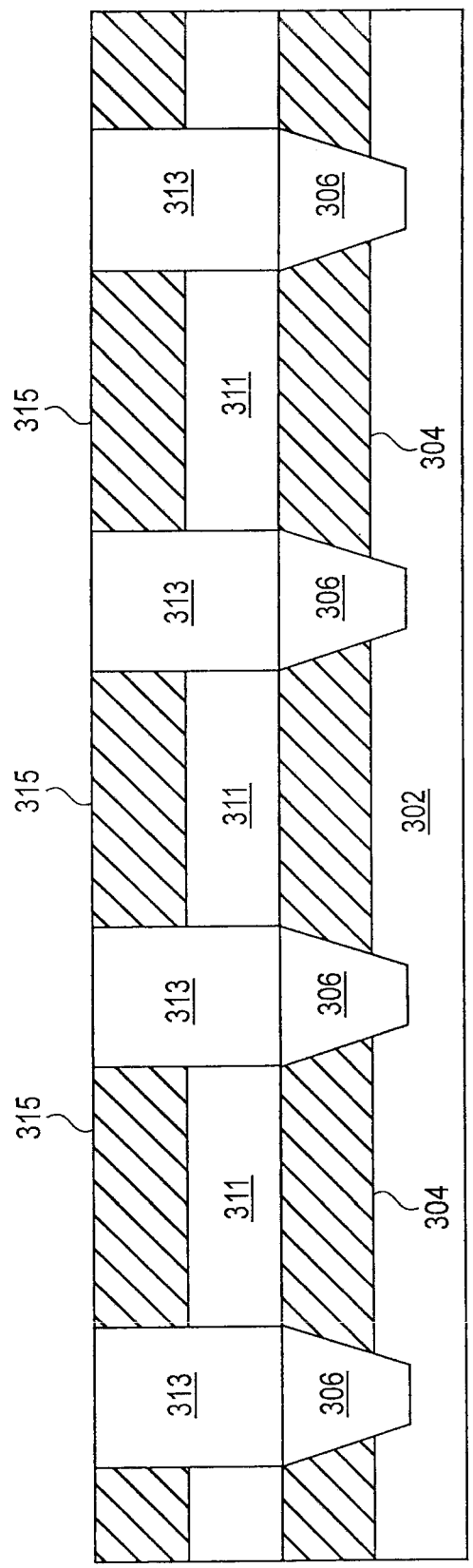
Figure 9D:
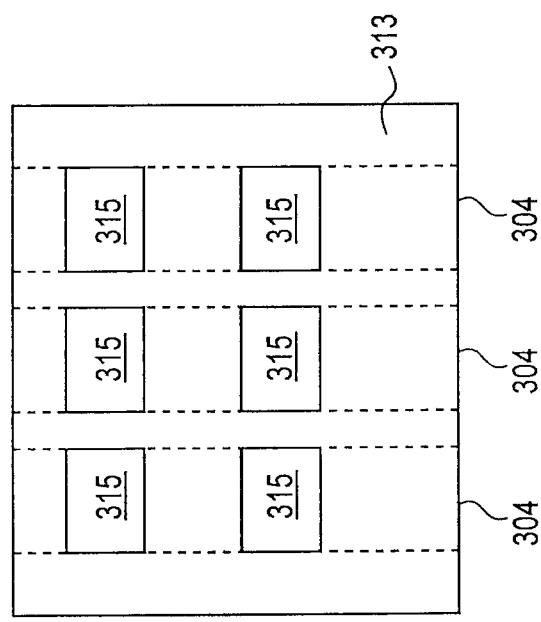

An additional method of forming the diodes is illustrated in FIG. 9C. In FIG. 9C, the n-doped region 304 is not subjected to p-type implantation as was illustrated in FIG. 9A. Instead, in FIG. 9C, an additional dielectric layer 313 is deposited above the n-doped region 304 and the trenches 306. Vias are etched into the dielectric layer 313. Epitaxial p- and n-doped layers 311, 315 are then deposited into the vias to create the diodes. Chemical/mechanical planarization is used to smooth the surface of the n-doped layer 315 and dielectric material 313. The resulting structure is identical in function and in the top view (FIG. 9D) to the structure described in relation to FIG. 9A.

Figure 10B:
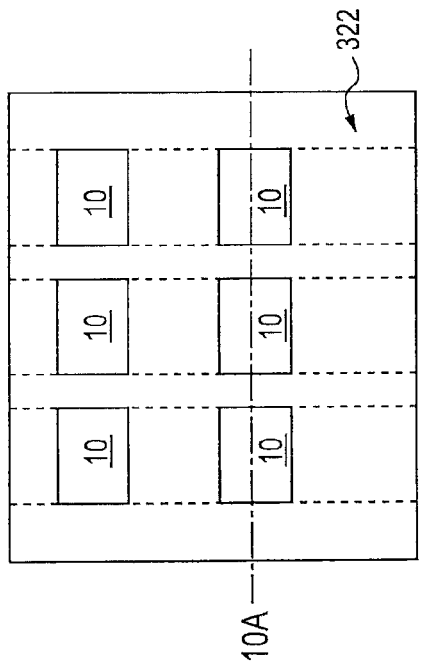
Figure 10A:
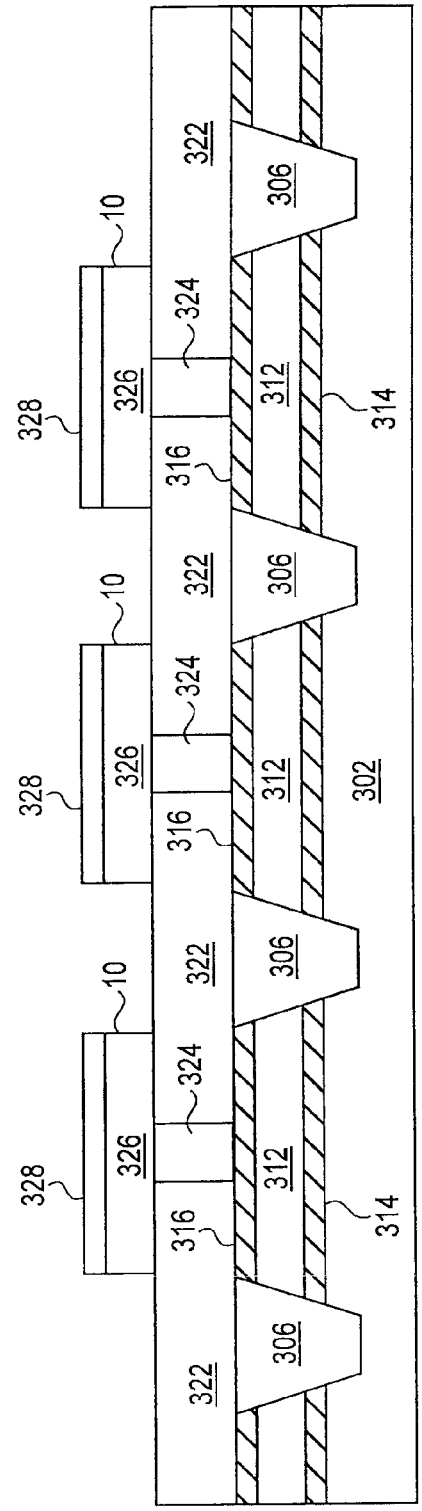

In FIGS. 10A and 10B, a first dielectric material layer 322 is deposited on top of the second n-doped regions 316 and the isolation trenches 306 (of FIG. 9A). Similarly, the first dielectric material layer 322 is deposited on top of the n-doped layer 315 and the dielectric material 313 (of FIG. 9C). In each case, above each back-to-back Zener diode, vias are etched through the first dielectric material layer 322 in order to form bottom electrodes 324. The bottom electrodes 324 may be formed from any generally conductive material that is used as an electrode, such as, for example, tungsten, platinum, titanium nitride, tantunum nitride, or titanium aluminum nitride. Following formation of the bottom electrodes 324, variable resistance material 326 such as phase change material is deposited on top of the bottom electrodes 324 and the first dielectric material layer 322. A top electrode layer 328 is also deposited on top of the variable resistance material 326. Photo and dry etch patterning are then used to create individual resistive memory cells 10 in a mesa, stripe or other via patterns.

Figure 11A:
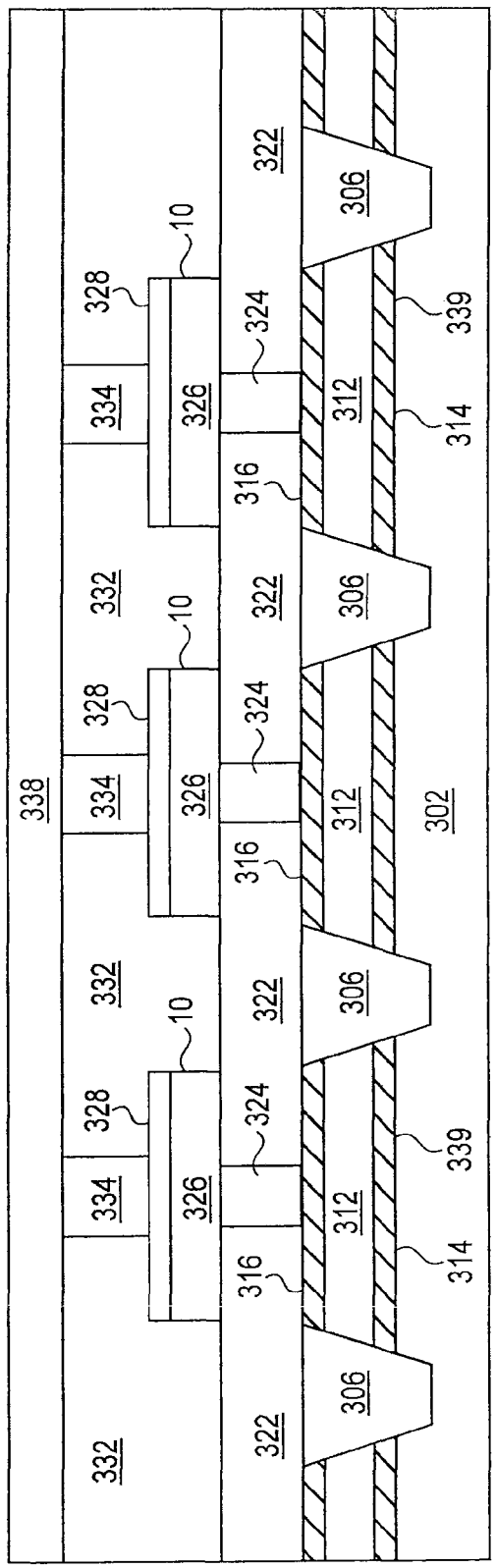
Figure 11B:
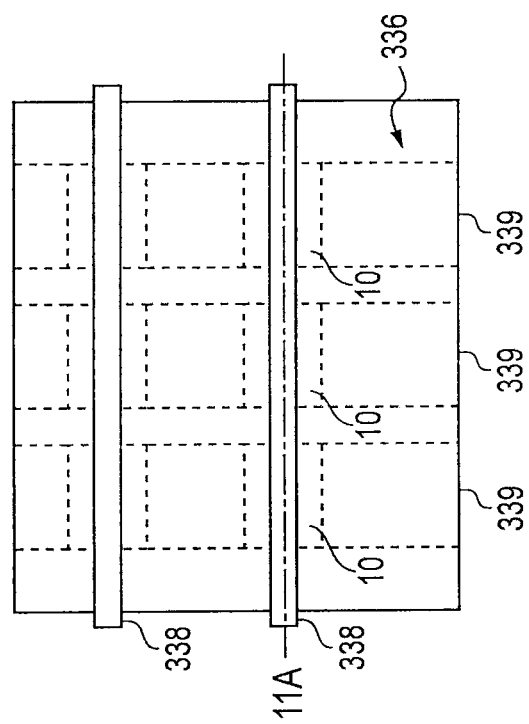

In FIGS. 11A and 11B, a second dielectric material layer 332 is deposited over the exposed memory cells 10 and first dielectric material layer 322 in order to isolate the memory cells 10. The deposited second dielectric layer 332 is subjected to chemical mechanical planarization. Then, vias are formed in the second dielectric material layer 332 above each top electrode 328. Conductive material is deposited in each via and is then subjected to chemical mechanical planarization in order to form electrical contacts 334 to the memory cell top electrodes 328. The electrical contacts 334 may again be formed from any generally conductive material that is used as an electrode, such as, for example, tungsten, platinum, titanium nitride, tantunum nitride, or titanium aluminum nitride. A third dielectric material layer 336 is deposited on top of the electrical contacts 334 and the second dielectric material layer 332. Then, bit lines 338 are formed in the third dielectric material layer 336. The bit lines 338 are formed to be perpendicular to the word lines 339, which consist of the first n-doped regions 314.

Figure 12A:
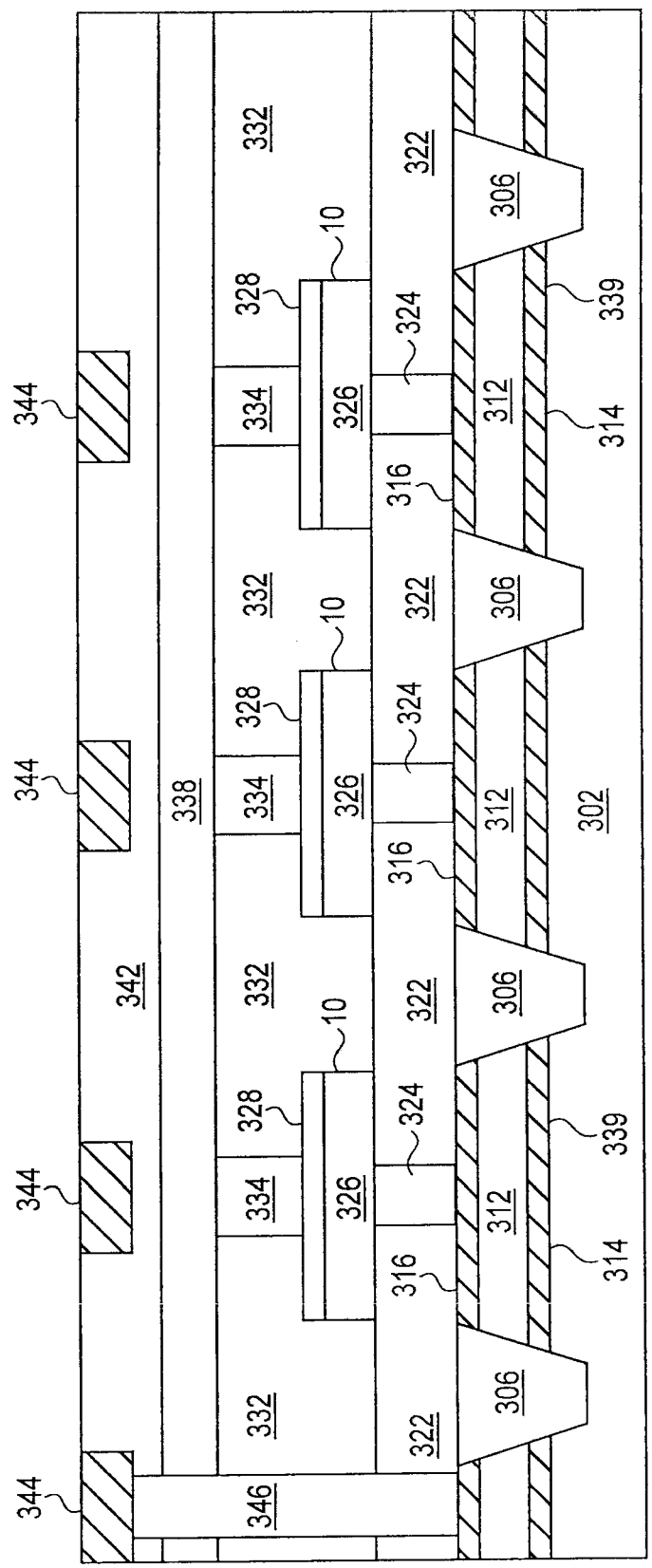

Because the word lines 339 are formed of a doped silicon material, word lines 339 have a high resistance and slow propagation time. In order to overcome this resistance, strap word lines are formed, as illustrated in FIGS. 12A and 12B. The strap word lines are highly conductive lines that interconnect to sections of word lines 339. The strap word lines thus have the ability to quickly conduct a word line signal to any area or section of array 200, and then via an interconnect, pass the word line signal to the appropriate word line 339. FIG. 12A illustrates the formation of strap word lines 344. A fourth dielectric layer 342 is deposited on top of the third dielectric layer 336 and the bit lines 338. Strap word lines 344 are then formed within the fourth dielectric layer 342 so as to be parallel to the word lines 339. Interconnects 346 are formed across multiple layers to connect the strap word lines 344 to the word lines 339.

Figure 13:
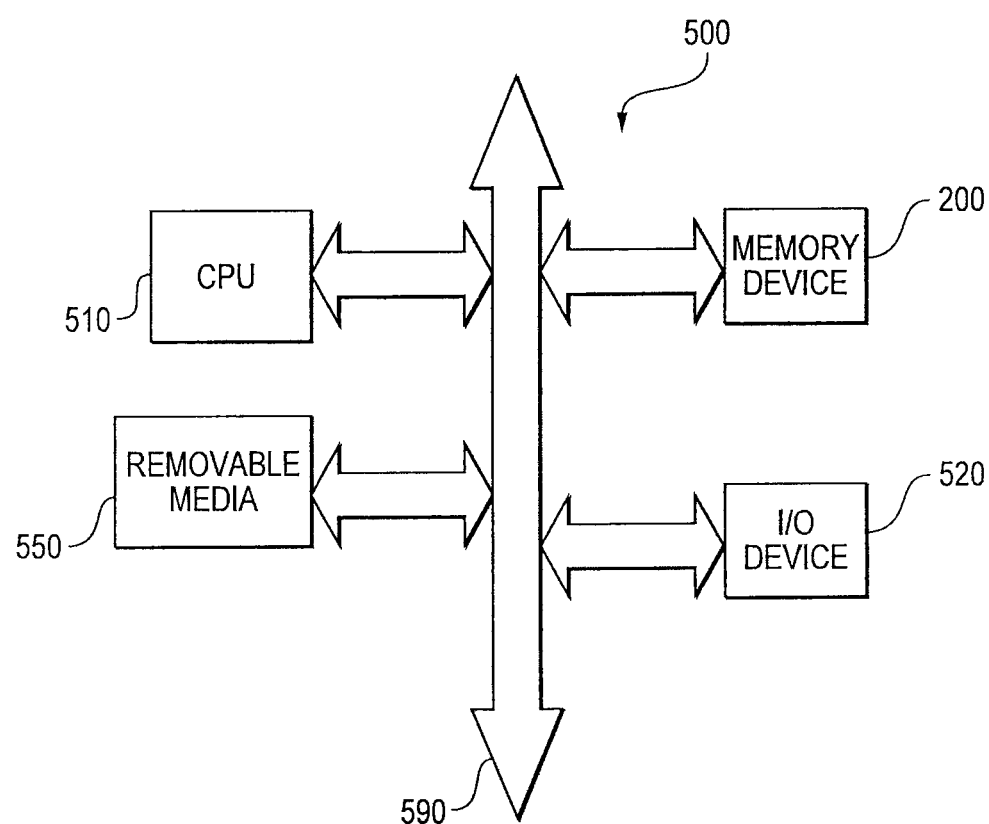
FIG. 13 illustrates a processor system that includes a memory device according to a disclosed embodiment.

It should be appreciated that the array 200 may be fabricated as part of an integrated circuit. The corresponding integrated circuits may be utilized in a typical processor system. For example, FIG. 13 illustrates a simplified processor system 500 which includes a memory device 200 in accordance with any of the above described embodiments. A processor system, such as a computer system, generally comprises a central processing unit (CPU) 510, such as a microprocessor, a digital signal processor, or other programmable digital logic devices, which communicates with an input/output (I/O) device 520 over a bus 590. The memory device 200 communicates with the CPU 510 over bus 590 typically through a memory controller.

In the case of a computer system, the processor system 500 may include peripheral devices such as removable media devices 550 (e.g., CD-ROM drive or DVD drive) which communicate with CPU 510 over the bus 590. Memory device 200 can be constructed as an integrated circuit, which includes one or more phase change memory devices. If desired, the memory device 200 may be combined with the processor, for example CPU 510, as a single integrated circuit.

The embodiments have been discussed with general reference to resistive memory and some specific references to phase change memory. It should be appreciated that although phase change material is an exemplary resistance variable material, the embodiments and claimed invention may be used with other types of resistive memories in order to, for example, reduce standby currents and improve delay times in resistive memory arrays.

The above description and drawings should only be considered illustrative of exemplary embodiments that achieve the features and advantages described herein. Modification and substitutions to specific process conditions and structures can be made. Accordingly, the claimed invention is not to be considered as being limited by the foregoing description and drawings, but is only limited by the scope of the appended claims.

What is claimed as new and desired to be protected by Letters Patent of the United States is:

1. A method comprising:
    forming at least one access device, wherein the access device comprises one of back-to-back Zener diodes, a four-layer diode, and a Triac diode, by acts comprising:
    forming a first conductively-doped region having a first conductivity type over a region of a second conductivity type, changing the conductivity type of a portion of the first conductively-doped region from the first conductivity type to the second conductivity type and a second portion of the first conductivity type where are separated by the portion changed to the second conductivity type; and
    forming at least one resistive memory cell coupled to said at least one access device.

2. The method of claim 1, wherein forming at least one access device comprises forming back-to-back Zener diodes.

3. The method of claim 1, wherein forming at least one access device comprises forming at least one four-layer diode.

4. The method of claim 1, wherein forming at least one access device comprises forming a Triac diode.

5. The method of claim 1, further comprising forming at least one strap line coupled to the first portion of the first conductively-doped region, the strap line comprising a material that is more conductive than the first portion of the first conductively-doped region.

* * * * *

UNITED STATES PATENT AND TRADEMARK OFFICE
CERTIFICATE OF CORRECTION

| | | |
|---|---|---|
| PATENT NO. | : 8,741,728 B2 | Page 1 of 1 |
| APPLICATION NO. | : 13/614513 | |
| DATED | : June 3, 2014 | |
| INVENTOR(S) | : Jun Liu et al. | |

It is certified that error appears in the above-identified patent and that said Letters Patent is hereby corrected as shown below:

In the Claims:

In column 8, line 30, in Claim 1, delete "where" and insert -- which --, therefor.

Signed and Sealed this
Nineteenth Day of August, 2014

Michelle K. Lee
*Deputy Director of the United States Patent and Trademark Office*